United States Patent
Luo et al.

(10) Patent No.: US 10,565,934 B2
(45) Date of Patent: Feb. 18, 2020

(54) DRIVE COMPENSATION CIRCUIT, DISPLAY PANEL AND DRIVING METHOD THEREOF

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Chang Luo, Beijing (CN); Haidong Wu, Beijing (CN); Jianpeng Wu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan Province (CN)

( * ) Notice: Subject to any disclaimer, the term of this patent is extended or adjusted under 35 U.S.C. 154(b) by 121 days.

(21) Appl. No.: 15/839,097

(22) Filed: Dec. 12, 2017

(65) Prior Publication Data

US 2018/0330668 A1 Nov. 15, 2018

(30) Foreign Application Priority Data

May 12, 2017 (CN) .......................... 2017 1 0336141

(51) Int. Cl.
*G09G 3/3258* (2016.01)
*G09G 3/3291* (2016.01)
(Continued)

(52) U.S. Cl.
CPC ......... *G09G 3/3258* (2013.01); *G09G 3/3291* (2013.01); *H01L 27/1225* (2013.01);
(Continued)

(58) Field of Classification Search
CPC ............... G09G 3/3258; G09G 3/3291; G09G 2320/0295; H01L 27/3225; H01L 27/3262;
(Continued)

(56) References Cited

U.S. PATENT DOCUMENTS

2009/0303162 A1* 12/2009 Kohno ................. G09G 3/3233
345/76
2010/0253706 A1* 10/2010 Shirouzu .............. G09G 3/2092
345/690

(Continued)

FOREIGN PATENT DOCUMENTS

CN 102971781 A 3/2013
CN 103383835 A 11/2013
(Continued)

OTHER PUBLICATIONS

The First Chinese Office Action dated Sep. 19, 2018; Appln. No. 201710336141.4.

*Primary Examiner* — Nitin Patel
*Assistant Examiner* — Amy Onyekaba
(74) *Attorney, Agent, or Firm* — Ladas & Parry LLP; Hermine Valizadeh

(57) ABSTRACT

A drive compensation circuit, an organic light-emitting diode (OLED) display panel and a driving method thereof. The drive compensation circuit includes a first power supply terminal, a second power supply terminal, a drive circuit, a voltage detection circuit and an OLED. The voltage detection circuit is configured to obtain a voltage value of the anode of the OLED, the first power supply terminal is configured to enable a first output voltage of the first power supply terminal to be larger than a second output voltage of the second power supply terminal, and the second power supply terminal is configured to allow the second output (Continued)

voltage of the second power supply terminal to be adjusted according to the voltage value of the anode of the OLED.

12 Claims, 6 Drawing Sheets

(51) Int. Cl.
- H01L 27/12 (2006.01)
- H01L 29/786 (2006.01)
- H01L 27/32 (2006.01)

(52) U.S. Cl.
CPC ...... H01L 27/1255 (2013.01); H01L 27/3262 (2013.01); H01L 27/3265 (2013.01); H01L 29/78648 (2013.01)

(58) Field of Classification Search
CPC ............ H01L 27/3265; H01L 27/1255; H01L 27/1225; H01L 29/78648
See application file for complete search history.

(56) References Cited

U.S. PATENT DOCUMENTS

| | | | |
|---|---|---|---|
| 2010/0259527 A1* | 10/2010 | Odawara | G09G 3/3233 345/211 |
| 2012/0327066 A1 | 12/2012 | Kato | |
| 2013/0009939 A1 | 1/2013 | Ebisuno et al. | |
| 2014/0253612 A1* | 9/2014 | Hwang | G09G 3/3258 345/691 |
| 2015/0310807 A1* | 10/2015 | Sun | G09G 3/3208 345/205 |
| 2016/0148564 A1* | 5/2016 | Kim | G09G 3/3233 345/211 |
| 2017/0124954 A1* | 5/2017 | Park | G09G 3/3258 |

FOREIGN PATENT DOCUMENTS

| | | | |
|---|---|---|---|
| CN | 105206222 A | * | 12/2015 |
| CN | 106531083 A | | 3/2017 |

* cited by examiner

DRIVE COMPENSATION CIRCUIT, DISPLAY PANEL AND DRIVING METHOD THEREOF

The present application claims priority to the Chinese patent application No. 201710336141.4, filed on May 12, 2017, the entire disclosure of which is incorporated herein by reference as part of the present application.

TECHNICAL FIELD

Embodiments of the present disclosure relate to a drive compensation circuit, a display panel and a driving method thereof.

BACKGROUND

Organic light emitting diode (OLED) is a kind of organic thin film electroluminescent device, and OLED has the advantages such as simple manufacturing process, fast response, high brightness, wide visual angle, active luminescence, ability of achieving flexible display and so on, therefore having broad application prospects.

An OLED display panel is different from a traditional liquid crystal display (LCD) panel, when the OLED display panel works, a voltage is applied across the anode and the cathode of the OLED device in the pixel unit of the OLED display panel to render the light emitting layer of the OLED device to emit light, different pixel units can emit light in different colors, and therefore full color display effect can be obtained. When an OLED device works, the voltage difference between the anode and the cathode of the OLED device should be maintained at a theoretical voltage difference, however, when the OLED device is in operation, a voltage drop can be generated as to the voltage of a power supply source due to the factors, such as process conditions, external environment, service time and so on, so there is a difference between actual voltage difference applied across the two terminals of the OLED device and the theoretical voltage difference intended to be applied across the two terminals of the OLED device, affecting the display effect of the OLED display panel.

SUMMARY

An embodiment of the present disclosure provides a drive compensation circuit, comprising a first power supply terminal, a second power supply terminal, a drive circuit, a voltage detection circuit and an organic light emitting diode (OLED). The drive circuit comprises an input terminal and an output terminal, the OLED comprises an anode and a cathode, the input terminal of the drive circuit is electrically connected to the first power supply terminal, the anode of the OLED is electrically connected to the output terminal of the drive circuit, the cathode of the OLED is electrically connected to the second power supply terminal, an input terminal of the voltage detection circuit is electrically connected to a first node between the anode of the OLED and the output terminal of the drive circuit, and the voltage detection circuit is configured to obtain a voltage value of the anode of the OLED, the first power supply terminal is configured to enable a first output voltage of the first power supply terminal to be larger than a second output voltage of the second power supply terminal, and the second power supply terminal is configured to allow the second output voltage of the second power supply terminal to be adjusted according to the voltage value of the anode of the OLED.

For example, the drive compensation circuit in an embodiment further comprises a switch circuit, the switch circuit comprises a control terminal, a first terminal and a second terminal, the control terminal of the switch circuit is configured to receive a control signal, the first terminal of the switch circuit is electrically connected to the first node between the anode of the OLED and the output terminal of the drive circuit, and the second terminal of the switch circuit is electrically connected to the input terminal of the voltage detection circuit.

For example, the drive compensation circuit in an embodiment further comprising a voltage adjustment circuit, the voltage detection circuit is further configured to output a detection result, the voltage adjustment circuit is configured to receive the detection result and adjust the second output voltage of the second power supply terminal according to the detection result.

For example, in the drive compensation circuit in an embodiment, the voltage adjustment circuit is electrically connected to the second power supply terminal, the voltage adjustment circuit comprises a memory circuit and a difference circuit, the memory circuit is configured to store a theoretical voltage value of the anode of the OLED, the difference circuit is configured to get a difference value between the detection result and the theoretical voltage value of the anode of the OLED.

Another embodiment of the present disclosure provides an organic light emitting diode (OLED) display panel, comprising a plurality of pixel units, a first power supply terminal, a second power supply terminal and a voltage detection circuit; each pixel unit comprises a drive circuit and an OLED, the drive circuit comprises an input terminal and an output terminal, the OLED comprises an anode and a cathode, the input terminal of the drive circuit is electrically connected to the first power supply terminal, the anode of the OLED is electrically connected to the output terminal of the drive circuit, the cathode of the OLED is electrically connected to the second power supply terminal, the pixel units comprise at least one detection pixel unit, an input terminal of the voltage detection circuit is electrically connected to a first node between the output terminal of the drive circuit and the anode of the OLED in the detection pixel unit, and the voltage detection circuit is configured to obtain a voltage value of the anode of the OLED in the detection pixel unit, the first power supply terminal is configured to enable a first output voltage of the first power supply terminal to be larger than a second output voltage of the second power supply terminal, and the second power supply terminal is configured to allow the second output voltage of the second power supply terminal to be adjusted according to the voltage value of the anode of the OLED in the detection pixel unit.

For example, the OLED display panel in an embodiment further comprises at least one switch circuit, a control terminal of the at least one switch circuit is configured to receive a first control signal, a first terminal of the at least one switch circuit is electrically connected to the first node between the anode of the OLED and the output terminal of the drive circuit in the detection pixel unit, and a second terminal of the at least one switch circuit is electrically connected to the input terminal of the voltage detection circuit.

For example, the OLED display panel in an embodiment further comprises a gate drive circuit, the gate drive circuit is configured to output the first control signal to control the at least one switch circuit to be turned on or turned off.

For example, in the OLED display panel in an embodiment, the gate drive circuit is further configured to output a second control signal to control the drive circuit of each of the pixel units.

For example, in the OLED display panel in an embodiment, the OLED display panel comprises a plurality of switch circuits, first terminals of the switch circuits are respectively electrically connected to nodes between anodes of OLEDs and output terminals of drive circuits in detection pixel units out of the pixel units, second terminals of switch circuits are electrically connected to the input terminal of the voltage detection circuit, the pixel units are arranged in an array, and the detection pixel units are uniformly distributed in the array of the pixel units.

For example, the OLED display panel in an embodiment further comprises a voltage adjustment circuit, the voltage detection circuit is further configured to output a detection result, the voltage adjustment circuit is configured to receive the detection result and adjust the voltage that is output from the second power supply terminal according to the detection result.

For example, in the OLED display panel in an embodiment, the voltage adjustment circuit is electrically connected to the second power supply terminal, the voltage adjustment circuit comprises a memory circuit and a difference circuit, the memory circuit is configured to store a theoretical voltage value of the anode of the OLED in the detection pixel unit, and the difference circuit is configured to get a difference value between the detection result and the theoretical voltage value of the anode of the OLED in the detection pixel unit.

For example, the OLED display panel in an embodiment further comprises a plurality of voltage detection circuits, the pixel units comprise detection pixel units, input terminals of the voltage detection circuits are respectively electrically connected to nodes between output terminals of drive circuits and anodes of OLEDs in detection pixel units out of the pixel units, and the voltage detection circuits are configured to obtain voltage values of anodes of the OLEDs of the detection pixel units, and the detection pixel units are distributed in different areas of the OLED display panel.

Still another embodiment of the present disclosure provides a driving method of an organic light emitting diode (OLED) display panel, the OLED display panel comprising a plurality of pixel units, a first power supply terminal, a second power supply terminal and a voltage detection circuit, the pixel units comprise at least one detection pixel unit, each of the pixel units comprising a drive circuit and an OLED, the drive circuit comprising an input terminal and an output terminal, and the OLED comprising an anode and a cathode, and the driving method comprising: detecting a first voltage that is applied to the anode of the OLED in the detection pixel unit to obtain a first voltage value; calculating a difference value between the first voltage value and a theoretical voltage value of the anode of the OLED in the detection pixel unit; and adjusting a second voltage value that is applied to the cathode of the OLED in at least one of the pixel units according to the difference value.

Still another embodiment of the present disclosure provides a driving method of an organic light emitting diode (OLED) display panel, the OLED display panel comprising a plurality of pixel units, a first power supply terminal, a second power supply terminal and a voltage detection circuit, each of the pixel units comprising a drive circuit and an OLED, the drive circuit comprising an input terminal and an output terminal, and the OLED comprising an anode and a cathode, and the driving method comprising: selecting a plurality of detection pixel units out of the pixel units, the detection pixel units being distributed in different areas of the OLED display panel; detecting first voltages that are applied to anodes of OLEDs of the detection pixel units in each area to obtain first voltage values; calculating difference values between an average value of the first voltage values and theoretical voltage values of the anodes of the OLEDs of the detection pixel units in each area; and adjusting second voltage values that are applied to the cathodes of OLEDs of the pixel units in each area according to the difference values.

Still another embodiment of the present disclosure provides a driving method of an organic light emitting diode (OLED) display panel, the OLED display panel comprising a plurality of pixel units, a first power supply terminal, a second power supply terminal and a voltage detection circuit, each of the pixel units comprising a drive circuit and an OLED, the drive circuit comprising an input terminal and an output terminal, and the OLED comprising an anode and a cathode, and the driving method comprising: selecting a plurality of detection pixel units out of the pixel units; detecting first voltages that are applied to anodes of OLEDs of the detection pixel units to obtain first voltage values; calculating difference values between an average value of the first voltage values and theoretical voltage values of anodes of the OLEDs of the detection pixel units; and adjusting second voltage values that are applied to cathodes of the OLEDs of the pixel units according to the difference values.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
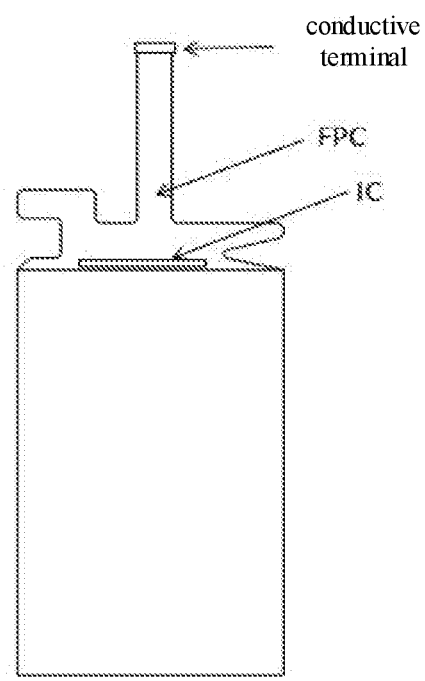
FIG. 1A is a plane schematic diagram of an OLED display panel.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to make the illustrations of the embodiments of the disclosure understandable and apparent, the detailed descriptions of the known functions and known components can be omitted here.

Organic light emitting diodes (OLEDs) can be divided into two types according to applied driving methods: passive matrix driving organic light emitting diode (PMOLED) and active matrix driving organic light emitting diode (AMOLED). A thin film transistor (TFT) with a switch function is provided in every pixel of an AMOLED display panel, every pixel can be controlled independently, and need not a constant back light source, and the AMOLED display panel has the advantages such as short response time, low power consumption, high contrast, wide visual angle, and so on. When the AMOLED display panel works, an integrated circuit (IC) drives every pixel unit, scan signals can be provided by a gate drive circuit, and data signals can be provided by a data drive circuit, the pixel circuit of every pixel unit can receive a corresponding data signal at corresponding time to apply a predetermined voltage to the two terminals of the OLED device of the pixel unit to drive the OLED to emit light, and different pixel units of the OLED can emit light in different colors, and therefore the display panel achieves full color display.

Figure 1B:
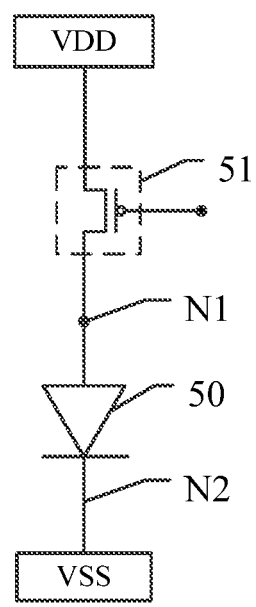
FIG. 1B is a schematic diagram of a pixel circuit of an OLED display panel.

FIG. 1A is a plane schematic diagram of an OLED display panel, and FIG. 1B is a schematic diagram of a pixel circuit of an OLED display panel. For example, as illustrated in FIG. 1B, in every pixel unit, an OLED device 50 comprises an anode N1 and a cathode N2, a voltage VDD is applied to the anode N1 via a driving transistor 51 and so on, a voltage VSS is applied to the cathode N2, therefore a voltage difference is formed between the two terminals of the OLED device because of the voltage VDD and the voltage VSS to drive the OLED device to work to emit light. The other circuit components of the pixel unit, such as a switch transistor, a storage capacitor and so on, are omitted in FIG. 1A.

As illustrated in FIG. 1A and FIG. 1B, when the OLED display panel works, the voltage VSS is directly applied to the cathode N2, and the voltage VDD is input to an input terminal of the IC through a conductive terminal on the main plate, a flexible panel circuit (FPC) and so on, and then under a control of a timing control signal, a scan signal, a data signal and so on, the voltage VDD is applied to the anode N1 of the OLED device 50 that is intended for display, the voltage VDD and the voltage VSS produce a voltage difference between the two terminals of the OLED device 50 and therefore generate a electrical current to flow through the OLED device 50 to drive the OLED device 50 to emit light. The light intensity of the OLED device 50 is related to the voltage difference value that is applied to the two terminals of the OLED device 50. The voltage VDD need to be applied to the anode N1 through kinds of electronic devices, such as FPC, TFT switch and so on; in the transmitting process, a voltage drop can be generated for the voltage VDD, that is, the voltage value of the voltage VDD at the input terminal of the IC is different from the voltage value of the voltage VDD that is finally applied to the anode N1, adjusting of the voltage VDD cannot directly and accurately control the voltage at the anode N1, while the voltage VSS is fixed, therefore the voltage difference value between the two terminals of the OLED device 50 is different from the theoretical voltage value, and the intensity of the light that is emitted by the OLED device 50 is different from the theoretical intensity, which therefore disadvantageously affects the display effect of the display panel and degrades the display quality of the display panel.

For example, the reasons of generating a voltage drop for the voltage VDD comprise the manufacturing process of TFT, the length of an external circuit, the application state of the OLED device, the service time of the OLED device and so on. For example, the pixel circuits of the OLED display panel are complex, every pixel circuit comprises a plurality TFT switch circuits, if the manufacturing process is not stable and uniform, the properties of the TFTs in different panels and/or different pixel circuits can be different from each other, and the voltage drop degrees that are generated for the voltage VDD in different pixel circuits are different, resulting in the difference of the voltages applied to the anodes of the OLED devices; in addition, after the OLED display panel is manufactured, the FPC and the IC should be bounded to the display panel, the voltage VDD is transmitted to the input terminal of the IC through the FPC by the main plate, and the electrical resistance of the FPC, the IC, anisotropic conductive adhesive film (ACF) and so on of different display panels are different, resulting in different voltage drops for the voltage VDD. For example, when the OLED display panel is used in different environments, for example, temperatures, humidity degrees and so on of different environments are different from each other, and the different environments can make the electrical resistance of each element of the circuit change, resulting in different voltage drops for the voltage VDD. On the other hand, with the service time lapsing, some phenomena can occur in the OLED display panel, such as aging of the circuit of the OLED display, change of the impedance in the circuit, also resulting in the voltage drop for the voltage VDD. In addition, the conductive wire in the circuit itself has line resistance, resulting in the voltage drop for the voltage VDD, for example, as for the OLED device 50 that is closer to the drive circuit, the voltage drop of the voltage VDD of the anode N1 of this OLED device 50 is smaller, and the display brightness is high, but as for the OLED device 50 that is farther away from the drive circuit, the voltage drop of voltage VDD of the anode N1 of this OLED device 50 is larger, and the display brightness is low, therefore resulting in the ununiformity of the display brightness.

The unstable voltage difference between the two terminals of the OLED device can generate kinds of bad display phenomena, such as low or high brightness of the whole display panel, ununiform brightness in different areas, yellowing or cyaning phenomenon of the display screen, and so on, seriously affecting the display effect, degrading the display quality and also probably reducing the service life of the OLED device.

An embodiment of the present disclosure provides a drive compensation circuit, an OLED display panel and a driving method thereof. The drive compensation circuit, comprising a first power supply terminal, a second power supply terminal, a drive circuit, a voltage detection circuit and an organic light emitting diode (OLED). The drive circuit comprises an input terminal and an output terminal, the OLED comprises an anode and a cathode, the input terminal of the drive circuit is electrically connected to the first power supply terminal, the anode of the OLED is electrically connected to the output terminal of the drive circuit, the cathode of the OLED is electrically connected to the second power supply terminal, an input terminal of the voltage detection circuit is electrically connected to a first node between the anode of the OLED and the output terminal of the drive circuit, and the voltage detection circuit is configured to obtain a voltage value of the anode of the OLED, the first power supply terminal is configured to enable a first output voltage of the first power supply terminal to be larger than a second output voltage of the second power supply terminal, and the second power supply terminal is configured to allow the second output voltage of the second power supply terminal to be adjusted according to the voltage value of the anode of the OLED.

The drive compensation circuit, for example, can be used for the OLED device, the drive compensation circuit employs a voltage detection circuit to detect the actual voltage that is applied to the anode of the OLED in the pixel unit and adjust the voltage that is applied to the cathode of the OLED according to the difference between the actual voltage of the anode of the OLED and the theoretical voltage intended to apply to the anode, achieving the compensation for the voltage across the two terminals of the OLED, therefore the actual voltage difference of the two terminals of the OLED can be equal to the theoretical voltage difference under different conditions, which improves the display quality of the display panel using the drive compensation circuit, improves the display effect and ensures the uniformity of the display brightness.

Some embodiments of the present disclosure will be described in detail in the following, but the specific embodiments are not limitative to the disclosure of the present application.

Figure 2:
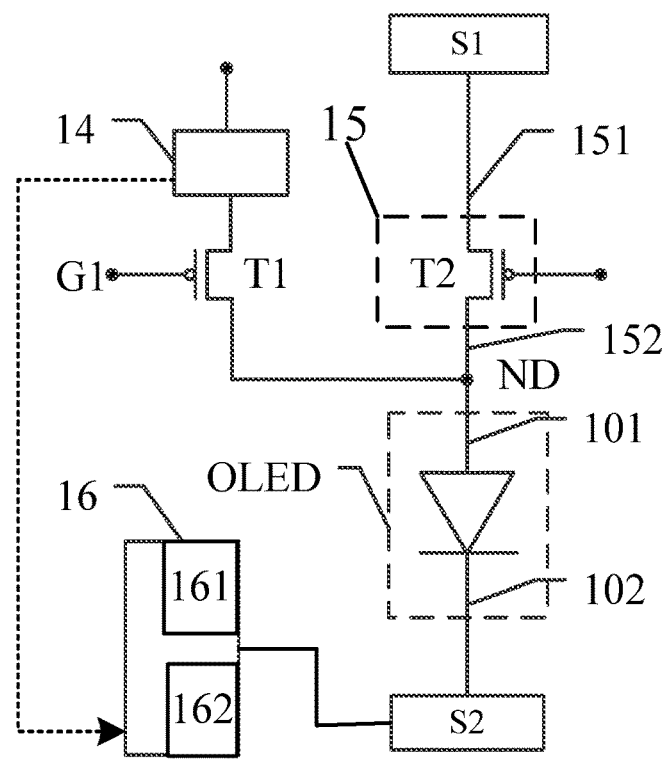
FIG. 2 is a schematic diagram of an OLED drive compensation circuit in an embodiment of the present disclosure.
Figure 3:
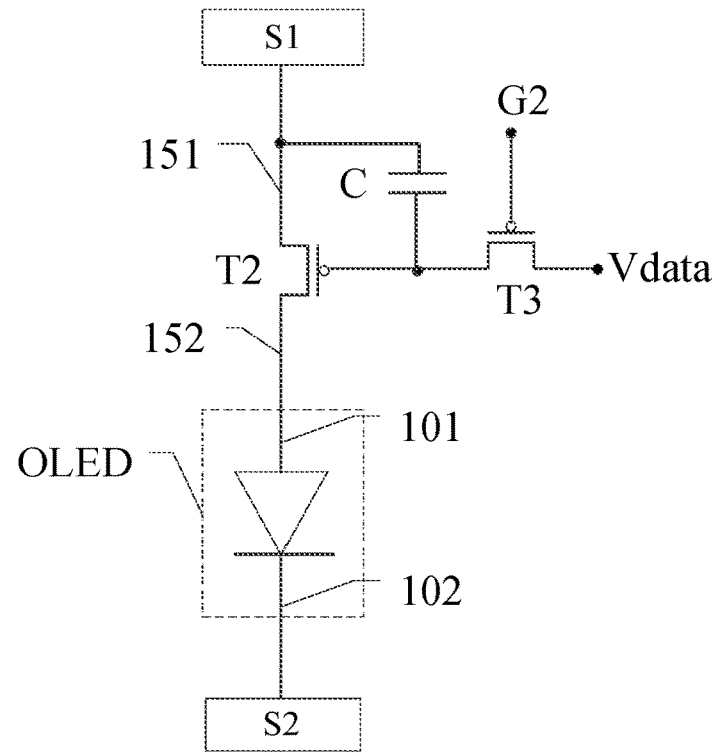
FIG. 3 is a schematic diagram of a drive circuit in an embodiment of the present disclosure.

An embodiment of the present disclosure provides a drive compensation circuit, the drive compensation circuit can be used for an OLED device; FIG. 2 is a schematic diagram of an OLED drive compensation circuit in the embodiment; and FIG. 3 is a schematic diagram of a drive circuit in the embodiment.

For example, as illustrated in FIG. 2, the OLED drive compensation circuit comprises a first power supply terminal S1, a second power supply terminal S2, a drive circuit 15, a voltage detection circuit 14 and an OLED, and the OLED drive compensation circuit can be used for an AMOLED display panel.

The input terminal 151 of the drive circuit 15 is electrically connected to the first power supply terminal S1; the anode 101 of the OLED is electrically connected to the output terminal 152 of the drive circuit 15, and the cathode 102 of the OLED is electrically connected to the second power supply terminal S2; an input terminal of the voltage detection circuit 14 is electrically connected to a first node ND between the anode 101 of the OLED and the output terminal 152 of the drive circuit 15, e.g., midway therebetween, and the voltage detection circuit 14 is configured to obtain a voltage value of the anode 101 of the OLED, a first output voltage of the first power supply terminal S1 is larger than a second output voltage of the second power supply terminal S2, and the second output voltage of the second power supply terminal S2 can be adjusted according to the voltage value of the anode of the OLED. It should be understood that here the first node ND is between the anode 101 of the OLED and the output terminal 152 of the drive circuit 15 and used to represent the position for realizing the electrical connection with the input terminal of the voltage detection circuit 14, however it does not mean that the first node ND is a physical component.

For example, the first output voltage of the first power supply terminal S1 is a positive voltage, and the second output voltage of the second power supply terminal S2 is a negative voltage; for example, the negative voltage can be output by a method, such as voltage doubling rectification method, DC-DC conversion method, voltage reverse connection method, single switch double voltage method, DC-DC module power supply method and so on. For example, the second power supply terminal S2 can be electrically connected to a negative voltage output terminal of a DC-DC power supply module to output a negative voltage. Or, the first power supply terminal S1 is electrically connected to a positive output terminal of a power supply to output a positive voltage, and the second power supply terminal S2 is electrically connected to a negative output terminal of a power supply to output a negative voltage. It should be noted that the output voltages of the first power supply terminal S1 and the second power supply terminal S2 can be both positive voltages, can also be both negative voltages, as long as the first output voltage of the first power supply terminal S1 is larger than the second output voltages of the second power supply terminal S2.

For example, the OLED drive compensation circuit in the embodiment can further comprise a first power supply line and a second power supply line (not shown in the figure) to respectively transmit voltage signals to the first power supply terminal S1 and the second power supply terminal S2.

For example, the voltage detection circuit 14 can comprise a measurement circuit. The measurement circuit is configured for measuring the first voltage of the anode 101 of the OLED to obtain a first voltage value. For example, the voltage detection circuit 14 can further comprise a rectification circuit and a filter circuit, the rectification circuit is configured for rectifying the obtained first voltage that varies between positive values and negative values at the anode 101 of the OLED to obtain a first direct current voltage, the filter circuit is configured for filtering the alternating current component of the first direct current voltage, reducing the ripple factor of the output voltage, and therefore the first voltage value with a flat waveform can be obtained.

For example, the measurement circuit can be implemented by a hardware circuit, and the measurement circuit, for example, can comprise a transistor, a resistance, a capacitor, an amplifier, and so on.

For example, the filter circuit can comprise passive components, and the passive components can comprise a resistor, an inductor, and a capacitor. For example, the filter circuit uses the energy storage characteristics for the voltage of the passive components to achieve the function of filtering. The filter circuit can be a capacitor filter circuit, an inductor filter circuit and so on.

For example, as illustrated in FIG. 2, the drive circuit 15 can comprise a drive transistor T2, the input terminal 151 of the drive circuit 15 can be an input terminal of the drive transistor T2, the output terminal of drive circuit can be the output terminal of the drive transistor T2, and a control terminal of the drive circuit is used for receiving a data signal. The drive transistor T2 is used for transmitting the output voltage of the first power supply terminal S1 to the anode 101 of the OLED under the control of the data signal that is used for display to drive the OLED to emit light with the brightness corresponding to the display data signal.

For example, as illustrated in FIG. 3, in another example, the drive circuit 15 can further comprise other elements except for the drive transistor T2, such as a switch transistor T3, a storage capacitor C, namely the drive circuit is in a 2T1C (i.e., two transistors and one capacitor) structure. A control terminal of the switch transistor T3 receives a second control signal G2, an input terminal of the switch transistor T3 is electrically connected to a data line Vdata, and the output terminal of the switch transistor T3 is electrically connected to the control terminal of the drive transistor T2. One terminal of the storage capacitor C is electrically connected to the input terminal of the drive transistor T2, and the other terminal of the storage capacitor C is electrically connected to a node between the control terminal of the drive transistor T2 and the output terminal of the switch transistor T3, the storage capacitor C is used for storing the data voltage (but not limited to the data voltage), and maintaining the stored data voltage to the beginning of the next frame scan during the display operation of the display panel, therefore enabling the drive transistor T2 to keep driving the OLED to emit light during each frame. For example, when the second control signal G2 is an ON signal (that is, turn-on signal), the switch transistor T3 is turned on, the data signal for display over the data line Vdata charges the storage capacitor via the switch transistor T3, the voltage of the storage capacitor C is used for providing the control signal to the control terminal of the drive transistor T2; when the second control signal G2 is an OFF signal (i.e., turn-off signal), the switch transistor T3 is turned off, the voltage that is stored in the storage capacitor C keeps providing the control signal to the control terminal of the drive transistor T2, enabling the drive transistor T2 to maintain in the turned-on state, therefore in the frame period, the OLED can keeps working as desired.

It should be noted that in the embodiment of the present disclosure, the drive circuit can also be in alternative structures, such as 3T1C, 4T2C and so on, for example, the drive circuit can also comprise a measurement transistor, a compensation transistor, a reset transistor and so on, the embodiment of the present disclosure are not limited in the specific structure of the drive circuit.

For example, the input terminal can be a source electrode of the transistor to input a signal; the output terminal can be a drain electrode of the transistor to output a signal; and the control terminal can be a gate electrode of the transistor to receive the control voltage and control the work state of the transistor. However, considering the symmetrical characteristics of the source electrode and drain electrode of the transistor, the input terminal can also be the drain electrode of the transistor, and the output terminal can be the source electrode of the transistor. For example, as for an N-type transistor, its (current) input terminal can be the drain electrode and the output terminal can be the source electrode; as for a P-type transistor, its (current) input terminal can be the source electrode and the output terminal can be the drain electrode. As for different type transistors, the electrical potentials of the control voltages of their control terminals are different. For example, as for an N-type transistor, when the control signal is at a high potential, the N-type transistor is in the ON state; and when the control signal is at a low potential, the N-type transistor is in the OFF state. As for a P-type transistor, when the control signal is at a low potential, the P-type transistor is in the ON state; and when the control signal is at a high potential, the P-type transistor is in the OFF state. The description of the present disclosure takes the P-type transistor as an example to illustrate, but it is known to those skilled in the art that any one of the transistors can also be an N-type transistor (for example, an N-type MOS transistor).

For example, the drive transistor T2 and the switch transistor T3 can be the field effect transistors, thin film transistors and so on. The thin film transistors can comprise oxide thin film transistor, amorphous silicon thin film transistor, polysilicon thin film transistor and so on according to the material of the active layer of each transistor.

For example, the drive transistor T2 and the switch transistor T3 can be P-type transistors, the input terminals of the drive transistor 12 and the switch transistor T3 are the source electrodes, the output terminals of the drive transistor T2 and the switch transistor T3 are the drain electrodes, and the control terminals of the drive transistor T2 and the switch transistor T3 are the gate electrodes.

For example, as illustrated in FIG. 2, the OLED drive compensation circuit in the embodiment can further comprise a switch circuit T1, the control terminal of the switch circuit T1 is configured to receive a first control signal G1, the first terminal of the switch circuit T1 is electrically connected to the first node ND between the anode 101 of the OLED and the output terminal 152 of the drive circuit, and the second terminal of the switch circuit T1 is electrically connected to the input terminal of the voltage detection circuit 14.

For example, the switch circuit T1 can be a transistor, it can be an N-type transistor, or it can also be a P-type transistor. For example, the switch circuit T1 can be a P-type thin film transistor (TFT), its control terminal is the gate electrode, and its first terminal is the source electrode while its second terminal is the drain electrode.

For example, in an example, the switch circuit T1, the drive transistor T2 and the switch transistor T3 that are described above can be manufactured by a low temperature polysilicon process to make the carrier migration rate of the transistor higher, so that the transistor can be made smaller, and the aperture ratio and accuracy of the OLED display panel using the OLED drive compensation circuit can be improved.

For example, as illustrated in FIG. 2, the OLED drive compensation circuit in the embodiment can further comprise a voltage adjustment circuit 16, and the voltage adjustment circuit 16 is electrically connected to the second power supply terminal S2 to adjust the output voltage of the second power supply terminal S2.

Foe example, the voltage detection circuit 14 is further configured to output a detection result, and the voltage adjustment circuit 16 receives the detection result (as illustrated by the dotted line in FIG. 2) and adjusts the output voltage of the second power supply terminal S2 according to the detection result. The detection result, for example, can be the first voltage value. It should be noted that the detection result can be the first voltage value that has been rectified and filtered.

For example, the voltage adjustment circuit 16 can comprise a memory circuit 161 and a difference circuit 162. The memory circuit 161 is configured to store a theoretical voltage value of the anode 101 of the OLED, and the difference circuit 162 is configured to obtain the difference between the correspondingly obtained first voltage value and the theoretical voltage value to get a voltage difference value. For example, the process to obtain the difference can comprise: subtracting the theoretical voltage value from the first voltage value; or subtracting the first voltage value from the theoretical voltage value.

For example, the difference circuit 162 can be implemented by a hardware circuit. The difference circuit 162, for example, can comprise elements such as transistors, resistances, capacitors, amplifiers and so on. The memory circuit 161 can also be implemented by a hardware circuit. For example, the memory circuit 161 can comprise a semiconductor storage device, a magnetic storage device and so on.

For example, the difference circuit can further comprise a processor. The memory circuit can further store a computer program that can be executed by the processor (e.g., a micro processor, digital signal processor, programmable logic controller, or the like), the computer program can be executed by the processor to realize the function of calculating the difference between the corresponding first voltage value of the anode 101 of the OLED and the theoretical voltage value.

For example, the voltage adjustment circuit 16 can further comprise an output circuit. The output circuit is used for receiving the voltage difference value that is obtained by the difference circuit and outputting the voltage difference value. The voltage difference value can be applied to the second power supply terminal S2, and therefore the output voltage of the second power supply terminal S2 can be adjusted.

It should be noted that the detection result that is output from the voltage detection circuit 14 can also be the voltage difference value between the first voltage value of the anode 101 of the OLED and the theoretical voltage value of the anode 101 of the OLED, therefore the voltage adjustment circuit 16 can directly adjust the output voltage of the second power supply terminal S2 according to the voltage difference value, enabling the voltage difference value between the two terminals of the OLED to be the same or substantially the same as the theoretical voltage difference value. In this situation, the voltage detection circuit 14 can further comprise a difference circuit and a memory circuit. The memory circuit is used for providing the theoretical voltage value of the anode 101 of the OLED; and the difference circuit is used for making a difference between the first voltage value and the theoretical voltage value.

For example, in at least one embodiment, the OLED device can comprise a first electrode, a function layer and a second electrode that are stacked sequentially. The first electrode corresponds to the anode 101 of the OLED, the second electrode corresponds to the cathode 102 of the OLED, and the function layer is between the first electrode and the second electrode. For example, in at least one embodiment, the function layer can be in a multilayer structure, for example the function layer can be a multilayer structure including a hole injection layer, a hole transport layer, a light emitting layer, an electron transport layer and an electron injection layer. For example, in at least one embodiment, the functional layer can also comprise a hole barrier layer and an electronic barrier layer, and the hole barrier layer can be arranged between the electron transport layer and the light emitting layer, for example, the electronic barrier layer can be arranged between the hole transport layer and the light emitting layer. The arrangement and the material of each layer in the function layer can be referred to the usual design, and the embodiments of the present disclosure are not limited in this aspect.

For example, the light emitting layer can be made of different light emitting materials to make the OLED emit light in different colors. In at least one embodiment, the material of the light emitting layer can comprise fluorescent light emitting material or phosphor light emitting material. At present, a doping system is usually used, that is, the available light emitting material can be obtained by mixing the doping material into the main light emitting material (or the matrix light emitting material). For example, the main light emitting material can comprise metal compound materials, anthracene derivatives, aromatic diamine compounds, triphenylamine compounds, aromatic triamine compounds, biphenyl diamine derivatives, tertiary aromatic amine polymers, and so on.

For example, the first electrode can be made of a transparent conductive material with a high work function, and the material of the electrode can comprise indium tin oxide (ITO), indium zinc oxide (IZO), indium gallium oxide (IGO), gallium zinc oxide (GZO), Zinc Oxide (ZnO), indium oxide ($In_2O_3$), aluminum zinc oxide (AZO), carbon nanotube and so on; the second electrode can be made of a material with high conductivity and a low work function, and the material of the electrode can comprise alloys, such as magnesium aluminum alloy (MgAl), lithium aluminum alloy (LiAl), and so on, and elementary metals, such as magnesium, aluminum, lithium, and so on.

Figure 4A:
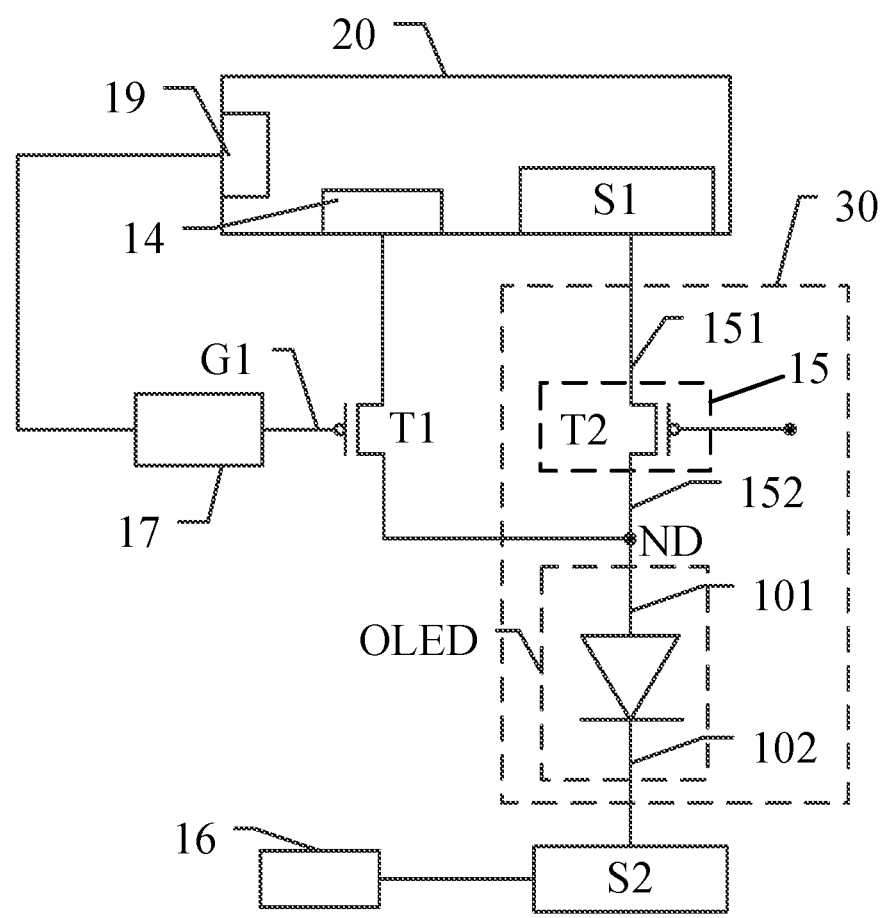
FIG. 4A is a schematic diagram of an OLED display panel in an embodiment of the present disclosure.
Figure 4B:
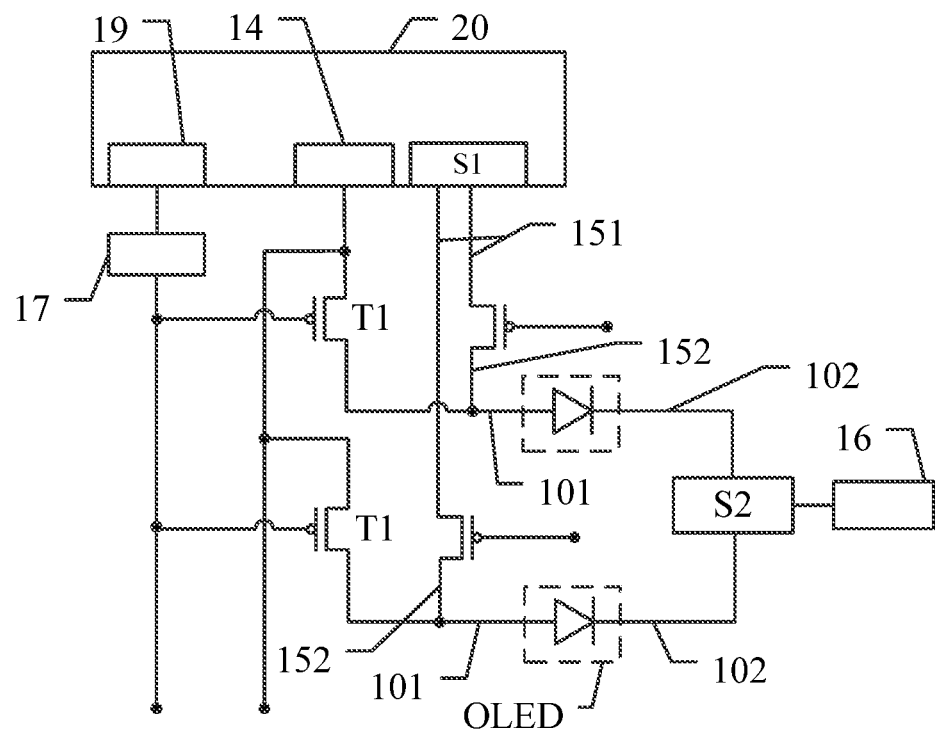
FIG. 4B is a schematic diagram of another OLED display panel in an embodiment of the present disclosure.

At least one embodiment of the present disclosure provides an organic light emitting diode (OLED) display panel, FIG. 4A is a schematic diagram of an OLED display panel in the embodiment; and FIG. 4B is a schematic diagram of another OLED display panel in the embodiment.

For example, as illustrated in FIG. 4A, the organic light emitting diode (OLED) display panel provided in the embodiment comprises a plurality of pixel units 30, a first power supply terminal S1, a second power supply terminal S2 and a voltage detection circuit 14. The pixel units 30 comprises at least one detection pixel unit having the detection function in addition to the normal display function. The figure only shows one pixel unit 30 which is also used as a detection pixel unit as an example, obviously the embodiment is not limited to the case of single pixel unit. Each pixel unit 30 comprises a drive circuit 15 and an OLED, the input terminal 151 of the drive circuit 15 is electrically connected to the first power supply terminal S1, the anode 101 of the OLED is electrically connected to the output terminal 152 of the drive circuit 15, the cathode 102 of the OLED is electrically connected to the second power supply terminal S2, the input terminal of the voltage detection circuit 14 is electrically connected to a first node ND between the output terminal 152 of the drive circuit 15 and the anode 101 of the OLED in this detection pixel unit, and the voltage detection circuit 14 is configured to obtain a voltage value of the anode 101 of the OLED, the first output voltage of the first power supply terminal S1 is larger than the second output voltage of the second power supply terminal S2, and the second output voltage of the second power supply terminal S2 can be adjusted according to the voltage value of the anode of the OLED.

For example, the OLED display panel can be divided into a display area and a peripheral area, for example, the display area is located in the central part of the display panel, the peripheral area is located on the edge part of the display panel for example and surrounds or partially surrounds the display area. The plurality of pixel units 30 are arranged in the display area of the OLED display panel. The display area is used for display, and the peripheral area can be used for arranging the electrode wires, the package structure of the display panel and so on. In at least one embodiment, the peripheral area can be located outside the display area, for example, the display area is surrounded by the peripheral area.

For example, the first power supply terminal S1, the second power supply terminal S2 and the voltage detection circuit 14 can be integrated into a drive chip 20.

For example, each pixel unit 30 can be a red pixel unit, a blue pixel unit, a green pixel unit, or a white pixel unit. The red pixel unit, the blue pixel unit and the green pixel unit can make up a light emitting unit, so that the light emitting unit can emit white light. For example, each pixel unit 30 can also be a cyan pixel unit, a fuchsin pixel unit or a yellow pixel unit.

For example, the OLED display panel in the embodiment can use red, green, blue pixels to independently emit light to achieve colorful display; for example, the OLED display panel in the embodiment can also use OLED to emit white light in cooperation with color filters to achieve colorful display; the OLED display panel in the embodiment can also use OLED to emit blue light, and then use the blue light to excite color conversion materials to obtain red light and green light, therefore achieving colorful display. It should be understood for those skilled in the art that the light emitting way of the OLED display panel is not limited to the above three ways, and is also not limited to the specific color of the light that is emitted.

For example, as illustrated in FIG. 4A, the OLED display panel can further comprise at least one switch circuit T1, and the switch circuit T1 can be arranged in the display area. The control terminal of the switch circuit T1 is configured to receive the first control signal G1, the first terminal of the switch circuit T1 is electrically connected to a first node ND between the anode 101 of the OLED and the output terminal 152 of the drive circuit 15 in this detection pixel unit, and the second terminal of the switch circuit T1 is electrically connected to the input terminal of the voltage detection circuit 14.

It should be noted that the arrangement of the switch circuit T1, the drive circuit, the voltage detection circuit 14 and so on can be referred to the related description in the above embodiments, for example, the drive circuit of the pixel unit can also be drive circuit with other structures besides the 2T1C structure, and can comprise but is not limited to 4T1C, 4T2C and so on, the relevant description is not repeat here for simplicity.

For example, as illustrated in FIG. 4A, the OLED display panel can further comprise a gate drive circuit 17 and a data drive circuit (not shown in the figure). The gate drive circuit 17 is configured to output the first control signal G1 to control the switch circuit T1 to be turned on or turned off. The data drive circuit is configured to output the data signal (voltage signal), which corresponds to the picture signal that is received by the display panel, to the data line that is connected with the pixel unit.

For example, the gate drive circuit 17 can be configured also to output a second control signal G2 to control the drive circuit of each of the pixel units. For example, the second control signal G2 can be applied to the control terminal of the switch transistor T3 of the drive circuit that is illustrated in FIG. 3 to control the switch transistor T3 to be turned on or be turned off. When the switch transistor T3 is turned on, the data signal that is used for display on the data line is applied to the control terminal of the drive transistor T2 of the drive circuit through the switch transistor T3, therefore the output voltage of the first power supply terminal S1 is transmitted to the anode 101 of the OLED by the drive transistor T2 under the control of the data signal, and therefore driving the OLED to emit light with the brightness corresponding to the data signal.

For example, in at least one embodiment, the gate drive circuit 17 can be formed on the OLED display panel, namely the OLED display panel uses the gate driver on array (GOA) technique, therefore the OLED display panel can implement super narrow bezel design. For example, in at least one embodiment, the gate drive circuit 17 can also be integrated on the drive chip 20, and be arranged on the display panel in an appropriate way.

For example, the gate drive circuit 17 can respectively provide the first control signal G1 and the second control signal of G2 to the switch circuit T1 and the switch transistor T3 in different time periods, therefore achieving the control for the switch circuit T1 under the condition that the drive chip does not increase the pin amount thereof; or, the gate drive circuit 17 can also comprise a first gate sub-circuit and a second gate sub-circuit, the first gate sub-circuit is used for providing the first control signal G1 for the switch circuit T1, the second gate sub-circuit is used for providing the second control signal G2 for the switch transistor T3, namely the light emitting operation of the OLED and the voltage detection operation for the anode 101 of the OLED can be performed at the same time, therefore the output voltage of the second power supply terminal S2 can be adjusted in real time, ensuring that the actual voltage difference between the two terminals of the OLED is equal to or approximately equal to the theoretical voltage difference, therefore improving the display effect and the display quality of the display panel.

For example, the gate drive circuit 17 can be electrically connected to a timing control circuit 19, and the timing control circuit 19 can generate the gate control signal based on a timing synchronization signal to control the gate drive circuit 17. The timing synchronization signal can be, for example, a vertical synchronous signal, a horizontal synchronization signal, a data enable signal, a clock signal and so on. The timing control circuit 19 can also be integrated in the drive chip 20.

For example, as illustrated in FIG. 4B, in at least one embodiment, the OLED display panel comprises a plurality of switch circuits T1 and a plurality of detection pixel units (two detection pixel units are illustrated as an example), the first terminals of the switch circuits are respectively electrically connected to the nodes between the anode 101 of the OLED and the output terminal 152 of the drive circuit in the detection pixel units (namely the pixel units that are detected) in the pixel units, the second terminals of switch circuits are electrically connected to the input terminal of the voltage detection circuit 14.

Figure 4C:
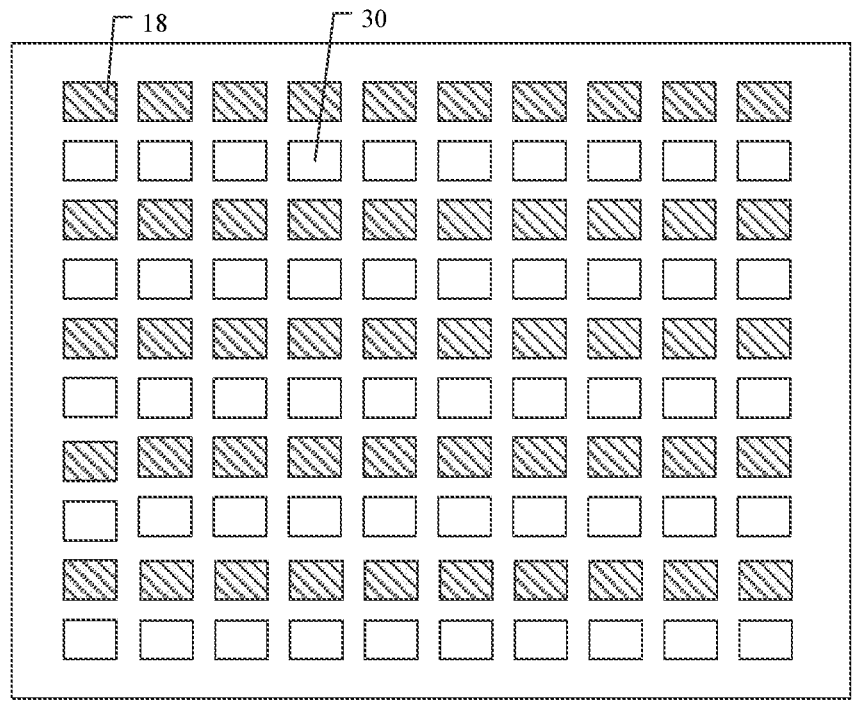
FIG. 4C is a schematic diagram of an arrangement of detection pixel units in an embodiment of the present disclosure.

For example, as illustrated in FIG. 4C, in at least one embodiment, pixel units 30 are arranged in an array on the OLED display panel, and the detection pixel units 18 can be uniformly distributed in the array of the pixel units. For example, fifty detection pixel units 18 can be selected, and the fifty detection pixel units 18 are uniformly distributed throughout the OLED display panel.

Figure 4D:
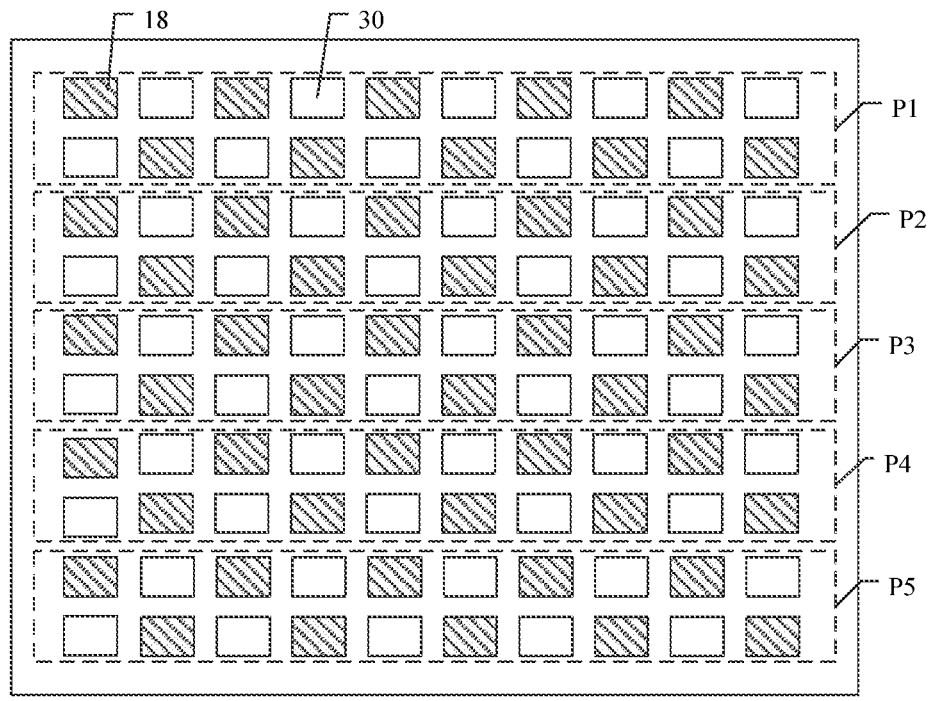
FIG. 4D is a schematic diagram of another arrangement of detection pixel units in an embodiment of the present disclosure.

For example, the position, the amount and so on of the detection pixel units 18 in arrangement can be adjusted as desired according to the factors such as the drive ability of the drive chip 20, the arrangement of the back plate circuit and so on. As illustrated in FIG. 4C, the detection pixel units 18 can be uniformly arranged in rows; as illustrated in FIG. 4D, in at least one embodiment, the detection pixel units 18 can also be uniformly and alternately arranged.

It should be noted that the detection pixel units 18 can also be arranged ununiformly. For example, because the conductive wire among the circuits have line resistance, therefore the line resistance of the conductive wire can generate a voltage drop on the output voltage of the first power supply terminal S1, the line resistance values of different conductive lines are different from each other, therefore the voltage drop of the anode 101 of the OLED in the area close to the drive chip 20 is small, the voltage drop of the anode 101 of the OLED in the area far away from the drive chip 20 is large, and the difference between the voltages of the anodes 101 of different OLEDs in the area far away from the drive chip 20 is large. Therefore, the density of the detection pixel units 18 in the area close to the drive chip 20 can be smaller than that in the area far away from the drive chip 20.

For example, as illustrated in FIG. 4A, in at least one embodiment, the OLED display panel can further comprise a voltage adjustment circuit 16, the voltage adjustment circuit 16 can also be integrated in the drive chip 20. The voltage adjustment circuit 16 is electrically connected to the second power supply terminal S2 to adjust the output voltage of the second power supply terminal S2. The voltage detection circuit 14 is further configured to output a detection result, the voltage adjustment circuit 16 receives the detection result, and adjusts the output voltage of the second power supply terminal S2 according to the detection result.

For example, the voltage adjustment circuit 16 can comprise a memory circuit and a difference circuit, the memory circuit is configured to store a theoretical voltage value at the anode of the OLED, the difference circuit is configured to obtain a difference between the detection result and the theoretical voltage value at the anode of the OLED. It should be noted that the specific arrangement and so on of the voltage adjustment circuit 16 can also be referred to the related description in the above embodiments, and the description is not repeated here for simplicity.

For example, in at least one embodiment, the OLED display panel can comprise a plurality of voltage detection circuits 14. The input terminals of the voltage detection circuits 14 are respectively electrically connected to the nodes between the output terminals 152 of the drive circuits 15 and the anodes 101 of the OLEDs in the detection pixel units 18 out of the pixel units 30, the voltage detection circuits 14 are configured to obtain the voltage values of the anodes 101 of the OLEDs, and the detection pixel units 18 are distributed in different areas of the OLED display panel.

For example, as illustrated in FIG. 4D, in at least one embodiment, the OLED display panel can be divided into five areas, i.e., areas P1, P2, P3, P4 and P5. For example, ten detection pixel units 18 can be selected in each area, and the ten detection pixel units 18 can be uniformly distributed in each area. For example, the detection pixel units 18 are uniformly and alternately arranged in each area. The OLED display panel can comprise five voltage detection circuits 14, the input terminals of the five voltage detection circuits 14 are respectively electrically connected to the detection pixel units 18 in areas P1, P2, P3, P4 and P5, and therefore respectively detect the voltage values of the anodes 101 of the OLEDs of the detection pixel units in the areas.

It should be noted that the OLED display panel can be uniformly divided into five areas, P1, P2, P3, P4 and P5, and can also be ununiformly divided. The detection pixel units 18 can also be ununiformly arranged. The embodiments are not limited in this aspect.

In order to illustrate more clearly, FIG. 4C and FIG. 4D only show a part of the unit pixels as the reference, but it does not mean that the OLED display panel only comprise these pixel units. It should be known for those skilled in the art that the OLED display panel is not limited to the amount of the pixel units that are illustrated in the figure, and is also not limited to the arrangement of the pixel units that are illustrated in the figure.

For example, the OLED display panel can further comprise a plurality of data lines, a plurality of first scan lines and a plurality of second scan lines. In at least one embodiment, the data lines can be parallel to one another and can extend along the column direction (for example, the longitudinal direction in FIG. 4C and FIG. 4D), the first scan lines can be parallel to one another and can extend along the row direction (for example, the transverse direction in FIG. 4C and FIG. 4D), the second scan lines can be parallel to one another and can also extend along the row direction as well, and the row direction and the column direction, for example, can be perpendicular to each other. The data lines can be electrically connected to the input terminals of the switch transistors T3 of the drive circuits to transmit the display data signal to the control terminals of the drive transistors T2, the first scan lines can be electrically connected to the control terminals of the switch transistors T3 to transmit the second control signals G2 to the control terminals of the switch transistors T3; and the second scan lines can be connected to the control terminals of the switch circuits T1 to transmit the first control signals G1 to the control terminals of the switch circuits T1.

Figure 5:
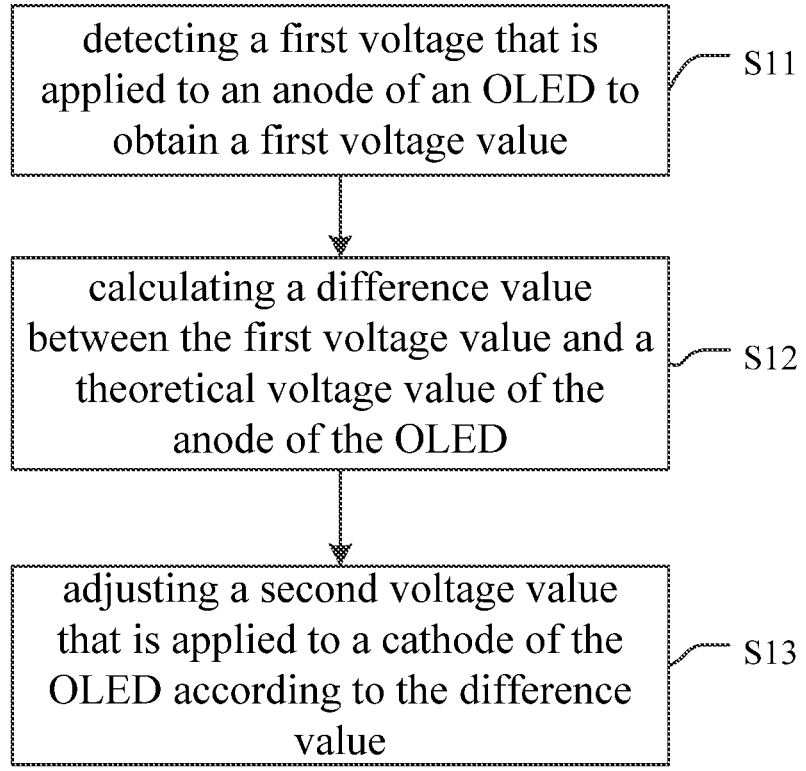
FIG. 5 is a flow diagram of a driving method of an OELD display panel in an embodiment of the present disclosure.

At least one embodiment of the present disclosure provides a driving method of an OLED display panel, and FIG. 5 is a flow diagram of the driving method of an OELD display panel in the embodiment.

For example, as for a detection pixel unit in the pixel units of the display panel, the driving method in the embodiment can comprises the following operations:

S11: detecting a first voltage that is applied to an anode of an OLED in the detection pixel unit to obtain a first voltage value;

S12: calculating a difference value between the first voltage value and a theoretical voltage value of the anode of the OLED in the detection pixel unit;

S13: adjusting a second voltage value that is applied to a cathode of the OLED in at least one pixel unit according to the difference value.

For example, assuming that the theoretical first voltage value of the anode of the OLED is 4.6V, the theoretical second voltage value of the cathode of the OLED is −4.4V, so the theoretical voltage difference between the two terminals of the OLED is 9V. However, due to factors, such as TFT manufacturing process, internal resistance of FPC, variation of environment temperature, and so on, a voltage drop is generated for the theoretical value of the first voltage value of the anode, for example, the voltage drop is 0.5V, that is, in actual operation, the first voltage value of the anode of the OLED is reduced to 4.1V. When the first voltage value is 4.1V is detected, the difference value between the first voltage value and the theoretical value of the first voltage value is calculated to be −0.5V. and then the second voltage value that is applied to the cathode of the OLED can be adjusted according to the difference value, letting the second voltage value be decreased to −4.9V. Because the voltage of the cathode of the OLED is directly provided by the integrated circuit, the second voltage value that is decreased to −4.9V can ensure that the voltage difference between the two terminals of the OLED reaches the theoretical voltage difference, namely the voltage difference between the two terminals of the OLED is still 9V, which ensure that the OLED can display normally and improve the display quality and the display effect. Here, "theoretical voltage difference" refers to the voltage difference in the condition that there is no voltage drop, no threshold drift and so on.

In the following description of the embodiment, assuming that the theoretical first voltage value of the anode of the OLED is 4.6V, and the theoretical second voltage value of the cathode of the OLED is −4.4V, obviously the other embodiments of the present disclosure are not limited to these specific values.

For example, in an example of the embodiment, the driving method can comprise: a plurality of detection pixel units are selected out of all the pixel units of the display panel; first voltages that are applied to the anodes of the OLEDs of the detection pixel units in each area are detected to obtain first voltage values; difference values between an average value of the first voltage values and the theoretical voltage values of the anodes of the OLEDs of the detection pixel units in each area are calculated; the second voltage values that are applied to the cathodes of the OLEDs the pixel units in each area are adjusted according to the difference values.

For example, in an example of the embodiment, as illustrated in FIG. 4C, fifty detection pixel units out of all the pixel units for display can be selected, the fifty detection pixel units are uniformly distributed in rows in the array that is formed by all the pixel units; the first voltages that are applied to the anodes of the OLEDs in the fifty detection pixel units are detected to obtain fifty first voltage values; then the difference values between an average value of the fifty first voltage values and the theoretical voltage values of the anodes of the OLEDs in the detection pixel units are calculated; finally, the second voltage values that are applied to the cathodes of the OLEDs of the pixel units are adjusted according to the difference values to ensure the OLEDs of the pixel units to operates as desired, realizing normal display.

Figure 6:
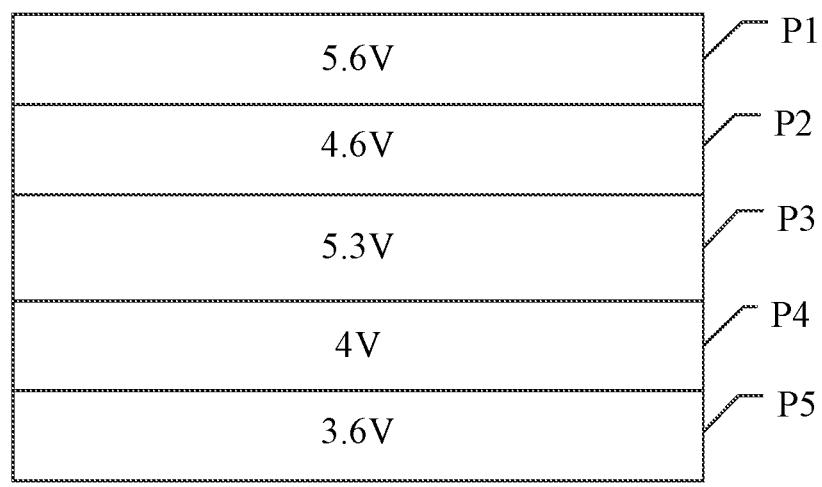
FIG. 6 is a distribution diagram of the average values of the first voltage difference values in different areas in an embodiment of the present disclosure.

For example, in an example of the embodiment, the driving method can comprise: a plurality of detection pixel units out of all the pixel units are selected, the detection pixel units are distributed in a plurality of different areas of the display panel; first voltages that are applied to the anodes of the detection pixel units are detected to obtain first voltage values; difference values between an average value of the first voltage values and the theoretical voltage value of the anodes of the detection pixel units in each area are calculated; and the second voltage values that are applied to the cathodes of the OLEDs of the pixel units in each area are adjusted according to the difference values For example, in an example of the embodiment, as illustrated in FIG. 4D and FIG. 6, fifty detection pixel units can be selected, the fifty detection pixel units are uniformly distributed in area P1, area P2, area P3, area P4 and area P5, for example, ten detection pixel units are selected in each area; the first voltages that are applied to the anodes of the OLEDs in the detection pixel units in each area are detected to obtain fifty first voltage values; then an average value of the ten first voltage values in each area are calculated, for example, the average value of the ten first voltage values in area P1 is 5.6V, the average value of the ten first voltage values in area P2 is 4.6V, the average value of the ten first voltage values in area P3 is 5.3V, the average value of the ten first voltage values in area P4 is 4V, and the average value of the ten first voltage values in area P5 is 3.6V, next, the difference values between the average value of the first voltage values in each area and the theoretical voltage value of the anodes of the OLEDs of the detection pixel units are calculated, five difference values are obtained: 1V, 0V, 0.7V, −0.6V, −1V; when the area P1 is scanned, because the difference value in area P1 is 1V, the second voltage values of the cathodes of the OLEDs of the pixel units in this area P1 are increased to −3.4V; when the area P5 is scanned, because the difference value of area P5 is −1V, the second voltage values of the cathodes of the OLEDs of the pixel units in this area are decreased to −5.4V. Therefore, the voltage difference value between the two terminals of the OLEDs of the pixel units can be controlled in different areas, thus improving the display effect and display quality, and improving the brightness uniformity of the OLED display panel.

It should be noted that the distribution of the first voltage values can be subject to normal distribution, and the average can be the expected value of the normal distribution.

For example, the detection of the voltage of the anode of the OLED can be set specifically according to the actual requirements, and the disclosure is not limited in this aspect. For example, the detection can be performed in conditions that, for example, the device is powered on, the screen has refreshed for a certain number of times (for example, 1000 times), a certain interval (such as a week) has passed, and so on, therefore realizing the voltage compensation and saving power consumption at the same time.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A drive compensation circuit, comprising a first power supply terminal, a second power supply terminal, a drive circuit, a voltage detection circuit and an organic light emitting diode (OLED),
wherein the drive circuit comprises an input terminal and an output terminal, the OLED comprises an anode and a cathode, the input terminal of the drive circuit is electrically connected to the first power supply terminal,
the anode of the OLED is electrically connected to the output terminal of the drive circuit, the cathode of the OLED is electrically connected to the second power supply terminal,
an input terminal of the voltage detection circuit is electrically connected to a first node between the anode of the OLED and the output terminal of the drive circuit, and the voltage detection circuit is configured to obtain a voltage value of the anode of the OLED, the first power supply terminal is configured to enable a first output voltage of the first power supply terminal to be larger than a second output voltage of the second power supply terminal, and the second power supply terminal is configured to allow the second output voltage of the second power supply terminal to be adjusted according to the voltage value of the anode of the OLED.

2. A drive compensation circuit, comprising a first power supply terminal, a second power supply terminal, drive circuit, a voltage detection circuit and an organic light emitting diode (OLED),
   wherein the drive circuit comprises an input terminal and an output terminal, the OLED comprises an anode and a cathode, the input terminal of the drive circuit is electrically connected to the first power supply terminal,
   the anode of the OLED is electrical connected to the output terminal of the drive circuit, the cathode of the OLED is electrically connected to the second power supply terminal,
   an input terminal of the voltage detection circuit is electrically connected to a first node between the anode of the OLED and the output terminal of the drive circuit, and the voltage detection circuit is configured to obtain a voltage value of the node of the OLED,
   the first power supply terminal is configured to enable a first output voltage of the first power supply terminal to be larger than a second output voltage of the second power supply terminal, and the second power supply terminal is configured to allow the second output voltage of the second power supply terminal to be adjusted according to the voltage value of the anode of the OLED,
   wherein the switch circuit comprises a control terminal, a first terminal and a second terminal, the control terminal of the switch circuit is configured to receive a control signal, the first terminal of the switch circuit is electrically connected to the first node between the anode of the OLED and the output terminal of the drive circuit, and the second terminal of the switch circuit is electrically connected to the input terminal of the voltage detection circuit.

3. The drive compensation circuit according to claim 1, further comprising a voltage adjustment circuit,
   wherein the voltage detection circuit is further configured to output a detection result, the voltage adjustment circuit is configured to receive the detection result and adjust the second output voltage of the second power supply terminal according to the detection result.

4. The drive compensation circuit according to claim 3, wherein the voltage adjustment circuit is electrically connected to the second power supply terminal,
   the voltage adjustment circuit comprises a memory circuit and a difference circuit, the memory circuit is configured to store a theoretical voltage value of the anode of the OLED, the difference circuit is configured to get a difference value between the detection result and the theoretical voltage value of the anode of the OLED.

5. An organic light emitting diode (OLED) display panel, comprising a plurality of pixel units, a first power supply terminal, a second power supply terminal and a voltage detection circuit,
   wherein each pixel unit of the plurality of pixel units comprises a drive circuit and an OLED, the drive circuit comprises an input terminal and an output terminal, the OLED comprises an anode and a cathode, the input terminal of the drive circuit is electrically connected to the first power supply terminal, the anode of the OLED is electrically connected to the output terminal of the drive circuit, the cathode of the OLED is electrically connected to the second power supply terminal, the plurality of pixel units comprise at least one detection pixel unit,
   an input terminal of the voltage detection circuit is electrically connected to a first node between the output terminal of the drive circuit and the anode of the OLED in the at least one detection pixel unit, and the voltage detection circuit is configured to obtain a voltage value of the anode of the OLED in the at least one detection pixel unit,
   the first power supply terminal is configured to enable a first output voltage of the first power supply terminal to be larger than a second output voltage of the second power supply terminal, and the second power supply terminal is configured to allow the second output voltage of the second power supply terminal to be adjusted according to the voltage value of the anode of the OLED in the at least one detection pixel unit.

6. The OLED display panel according to claim 5, further comprising at least one switch circuit,
   wherein a control terminal of the at least one switch circuit is configured to receive a first control signal, a first terminal of the at least one switch circuit is electrically connected to the first node between the anode of the OLED and the output terminal of the drive circuit in the at least one detection pixel unit, and a second terminal of the at least one switch circuit is electrically connected to the input terminal of the voltage detection circuit.

7. The OLED display panel according to claim 6, further comprising a gate drive circuit,
   wherein the gate drive circuit is configured to output the first control signal to control the at least one switch circuit to be turned on or turned off.

8. The OLED display panel according to claim 7, wherein, the gate drive circuit is further configured to output a second control signal to control the drive circuit of each of the plurality of pixel units.

9. The OLED display panel according to claim 6, wherein the OLED display panel comprises a plurality of switch circuits,
   first terminals of the plurality of switch circuits are respectively electrically connected to nodes between anodes of OLEDs and output terminals of drive circuits in detection pixel units of the plurality of pixel units, second terminals of the plurality of switch circuits are electrically connected to the input terminal of the voltage detection circuit,
   the plurality of pixel units are arranged in an array, and the detection pixel units are uniformly distributed in the array of the plurality of pixel units.

10. The OLED display panel according to claim 6, further comprising a voltage adjustment circuit,
    wherein the voltage detection circuit is further configured to output a detection result, the voltage adjustment circuit is configured to receive the detection result and adjust a voltage that is output from the second power supply terminal according to the detection result.

11. The OLED display panel according to claim 10, wherein the voltage adjustment circuit is electrically connected to the second power supply terminal,
    the voltage adjustment circuit comprises a memory circuit and a difference circuit, the memory circuit is configured to store a theoretical voltage value of the anode of the OLED in the at least one detection pixel unit, and the difference circuit is configured to get a difference value between the detection result and the theoretical voltage value of the anode of the OLED in the at least one detection pixel unit.

12. The OLED display panel according to claim 5, comprising a plurality of voltage detection circuits,
wherein the plurality of pixel units comprise detection pixel units, input terminals of the plurality of voltage detection circuits are respectively electrically connected to nodes between output terminals of drive circuits and anodes of OLEDs in detection pixel units of the plurality of pixel units, and the plurality of voltage detection circuits are configured to obtain voltage values of anodes of the OLEDs of the detection pixel units,
the detection pixel units are distributed in different areas of the OLED display panel.

* * * * *